United States Patent [19]

Wakimoto et al.

[11] Patent Number: 4,725,980

[45] Date of Patent: Feb. 16, 1988

[54] READ ONLY MEMORY CIRCUIT

[75] Inventors: Hideyuki Wakimoto, Kawasaki; Masanobu Yoshida, Kawaguchi, both of Japan

[73] Assignee: Fujitsu Limited, Kanagawa, Japan

[21] Appl. No.: 798,782

[22] Filed: Nov. 18, 1985

[30] Foreign Application Priority Data

Nov. 20, 1984 [JP] Japan .................................. 59-243326

[51] Int. Cl.[4] .................. H01L 29/78; H03K 5/13; G11C 11/34; G11C 17/00
[52] U.S. Cl. .................................. 365/185; 365/200; 365/177; 365/104; 365/182; 307/202.1; 307/468; 307/581; 307/584; 357/23.5; 357/54
[58] Field of Search ............... 357/54, 23.5; 365/200, 365/104, 177, 182, 185; 307/202.1, 468, 581, 584

[56] References Cited

U.S. PATENT DOCUMENTS

| | | | |
|---|---|---|---|
| 4,245,165 | 1/1981 | Hoffman | 307/238 |
| 4,375,087 | 2/1983 | Wanlass | 365/218 |
| 4,583,201 | 3/1986 | Bertin et al. | 365/104 |

Primary Examiner—Martin H. Edlow
Assistant Examiner—D. Featherstone
Attorney, Agent, or Firm—Armstrong, Nikaido, Marmelstein & Kubovcik

[57] ABSTRACT

A ROM circuit is used in place of a conventional fuse type ROM which is incorporated in a semiconductor integrated circuit network together with other circuit blocks on a chip. The ROM circuit comprises a first transistor having a control and a floating gate and a depletion type second transistor having a gate formed as an extension of the floating gate. The second transistor outputs a high level control signal if hot electrons have been accumulated on the floating gate of the first transistor by the application of a predetermined high level input signal to the control gate thereof, and outputs a low level signal when the high level input signal has not been provided to the control gate. The first transistor is freed from a soft write problem because it is separated from a voltage source in the read mode.

6 Claims, 7 Drawing Figures

READ ONLY MEMORY CIRCUIT

BACKGROUND OF THE INVENTION

The present invention relates to a semiconductor integrated circuit, and more specifically to a read only memory circuit suitable for incorporation into an integrated circuit.

Generally, to achieve a high product yield, one or more redundant circuit blocks are provided for semiconductor integrated circuits, particularly for semiconductor memory devices. The redundant circuit blocks are usually formed in advance on a semiconductor chip to form an integrated circuit network with other circuit blocks. If a faulty circuit, a memory cell, for example, is found during tests performed on the fabricated integrated circuit, the faulty circuit is replaced by a redundant circuit having equivalent specialized functions, and thus, the desired comprehensive functions of the integrated circuit can be ensured.

In a conventional semiconductor integrated circuit equipped with such redundant circuit blocks, there is also a circuit having a fuse with which the circuit generates control signals to indicate the use of the redundant circuit blocks according to the ON or OFF state of the fuse.

FIG. 4 is an equivalent circuit diagram shown in an exemplary convention control signal generating circuit, a type of read only memory (ROM), including the fuse. Referring to FIG. 4, a fuse 51 is turned OFF by supplying an input signal B to the gate of an n-channel transistor 52. One end of the fuse 51 is connected to a voltage source Vcc (+5 volts, for example) and the other end of the fuse is connected to a node of a resistor 53 and the drain of the transistor 52. The control signal (output signal) C is provided from the node. When the fuse 51 is held ON, the voltage at the node is substantially equal to Vcc and the control signal C is at a high level. If the fuse 51 is OFF, the node voltage, i.e., the control signal changes to a low level.

The OFF state of the fuse is realized as follows: when the transistor 52 is turned ON by an input signal B of a predetermined voltage applied to the gate thereto, a large current flows through the transistor 52, and thus, the fuse 51 is blown by the current and thus becomes OFF.

The replacement of a faulty circuit in a semiconductor integrated circuit is described by taking a faulty memory on a memory chip as an example. If a faulty memory cell is detected during the chip test process, the fuses are turned OFF or remain ON to produce a binary information consisting of high level (1) and/or low level (0) signals, corresponding to the respective addresses of the row and column of the faulty cell. In the circuit of FIG. 4, a low level signal (0) is output if the fuse 51 is turned OFF, as mentioned above. During the access of the memory chip, the address input to the memory chip is compared with the information comprising the high and/or low level signals corresponding to the states of the fuses, and if a correspondence between the addresses and the information is detected, the row and column corresponding to the faulty cell is operatively disconnected from the memory circuit and the redundant circuit block is connected instead. Thus, a faulty circuit containing the faulty memory cell is replaced by the redundant circuit block.

To summarize the above, one or more fuses are used as a ROM for indicating the use of the redundant circuit block in a conventional semiconductor integrated circuit. The incoming address signals are compared with the combination of the ON or OFF states of the fuses and a determination of whether they correspond to the address signals corresponding to the faulty circuit or not is carried out. If the correspondence between the incoming address signals and the address of the faulty circuit is detected, the redundant circuit block is instructed to substitute for the faulty circuit.

However, an erroneous ON state sometimes occurs in a ROM having the above described fuses due to an insufficient blowing of the fuse by the electric current during the write-in operation. This is because the fuses are usually formed from thin film lines of polysilicon, for example, embedded in an insulating matrix such as a silicon dioxide layer. An insufficiently blown fuse could recover its conduction even if it had lost the conduction just after the write-in operation. Thus, a fuse, which should be made OFF, remains ON and produces erroneous information.

The destructive technique of blowing the fuse provides another kind of disadvantage such as producing cracks in the cover layer which is usually a glass layer formed on the surface of a semiconductor chip for the passivation purposes. This results in the failure of a semiconductor integrated circuit formed thereunder due to the absorption of moisture which penetrates through the cracks and gives deleterious influences to the circuit. Accordingly, the reliability of the ROM including fuses is insufficient for high quality integrated circuits, in general.

SUMMARY OF THE INVENTION

It is, therefore, the primary object of the present invention to provide a high reliability ROM circuit.

It is another object of the present invention to provide a ROM circuit based on a non-destructive means.

It is still another object of the present invention to provide a ROM circuit suited to be incorporated in an integrated circuit network on a semiconductor chip.

More specifically, it is an object of the present invention to provide a ROM circuit to be incorporated in an integrated circuit which produces control signals for informing of the use of a redundancy circuit.

It is yet another object of the present invention to provide a ROM circuit having a relatively simple configuration.

The above objects can be attained by providing a ROM circuit comprising terminal means for receiving a predetermined input signal, a first transistor, a depletion type second transistor and first and second resistive means. The first transistor has a channel region, a control gate formed to face the channel region and connected to the terminal means, a floating gate formed between the control gate and the channel region, and a source or drain. The second transistor has a gate, which is connected to the floating gate of the first transistor, and a source or drain. Further, the first resistive means is connected between the control gate and the source or drain of the first transistor, and the second resistive means is connected between the source or drain of the second transistor and a voltage source. When the control gate is provided with the predetermined input signal applied to the terminal means, information corresponding to the input signal is stored on the floating gate, and the second transistor operatively outputs a high or low signal form the node of its source or drain and the second resistive means according to the predetermined input signal.

In the above configuration, when an input signal of a predetermined high voltage is provided to the control gate of a first transistor, negative charges (electrons) are accumulated on the floating gate thereof, and the second transistor turns off due to the negative potential on the gate thereof, which is connected to the floating gate. On the other hand, when the input signal is not applied to the control gate of the first transistor, the accumulation of electrons on the floating gate does not occur, and hence, the second transistor maintains its conduction. Thus, the second transistor is either turned-on or turned-off according to the existence of electrons accumulated on the floating gate, and a control signal corresponding to the on or off state is provided from the second transistor. The control signal can be used for informing whether a faulty circuit, a memory circuit containing a faulty memory cell, for example, is replaced by a redundant circuit as explained before.

BRIEF DESCRIPTION OF THE DRAWINGS

The above and other related objects and features of the present invention will be apparent in a reading of the following description of the disclosure taken in connection with accompanying drawings forming a part thereof, in which.

DESCRIPTION OF THE PREFERRED EMBODIMENTS

Figure 1:
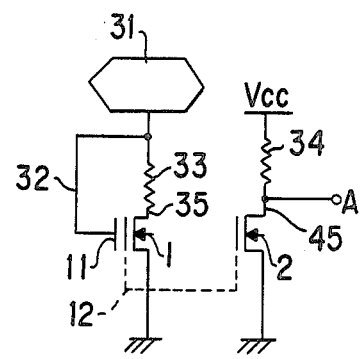
FIG. 1 is an equivalent circuit diagram showing a control signal generating circuit in accordance with an embodiment of the present invention.

FIG. 1 is an equivalent circuit diagram showing a ROM circuit for generating a control signal in accordance with the aforesaid objects of the present invention. Referring to FIG. 1, a first transistor 1, which is an n-channel transistor, comprises a control gate 11 and a floating gate 12 formed facing the control gate 11. A predetermined voltage input signal is applied to the control gate 11 via a terminal means 31 such as a pad and a wiring line 32 of aluminum, for example. The arrangement of the control gate 11 and the floating gate 12 will be shown later with reference to FIG. 2, a plan view, and FIGS. 3A-3C, cross-sectional views.

In FIG. 1, a second transistor 2, which is an n-channel transistor, has a gate connected to the floating gate 12 of the first transistor 1. The gate of the second transistor 2 and the floating gate 12 of the first transistor 1 may be formed from a common conductive layer. The second transistor 2 is a depletion type so that it maintains conduction when the gate thereof is not provided with a negative potential by the floating gate 12. The drain 35 of the first transistor 1 is connected to a pad 31 via the first resistive means 33, and the drain 45 of the second transistor 2 is connected to a DC voltage source Vcc via the second resistive means 34. A control signal A is output from the node of the second transistor 2 and the second resistive means 34.

Figure 2:
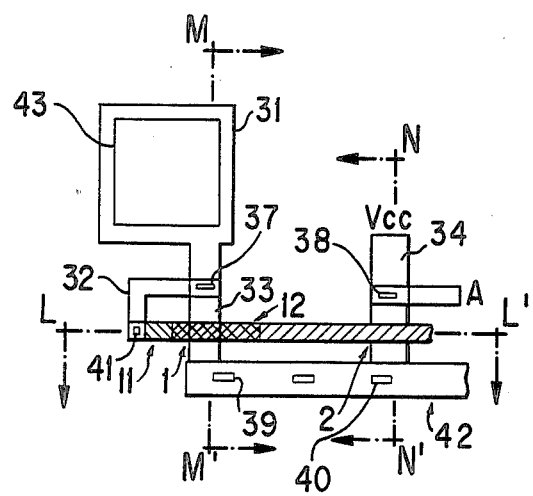
FIG. 2 is a plan view illustrating an exemplary pattern for constituting the circuit of FIG. 1.

FIG. 2 is a plan view illustrating an exemplary pattern for forming the circuit of FIG. 1, and FIGS. 3A-3C are cross-sections taken respectively along the lines L—L', M—M' and N—N' in FIG. 2. In these drawings, like reference numerals designated like or corresponding parts in FIG. 1. Referring to FIG. 2, the pad 31 is generally formed from aluminum, and the wiring line 32 of aluminum, for example, interconnects the pad 31 and the control gate 11 of the first transistor 1. The first and second resistive means 33 and 34 may be formed by using respective appropriate MOS transistors, however, respective parts of the diffusion layers forming the source of drain regions of the first transistor 1 and second transistor 2 are used as a substitute for the MOS transistors as is easily understood from FIG. 2, wherein the diffusion layer forming the resistive means 33 is connected to the pad 31 via a contact 37. The node for outputting the control signal A is formed through the contact 38 to the diffusion layer part constituting the resistive means 34. The contacts 39 and 40 connect the first transistor 1 and second transistor 2 to ground line 42, and the contact 41 interconnects the control gate 11 and the wiring line 32. In FIG. 2, reference numeral 43 designates the contour of an opening formed to expose the pad 31 through a passive layer on the semiconductor circuit of FIG. 1 as shown later in FIG. 3B.

Figure 3A:
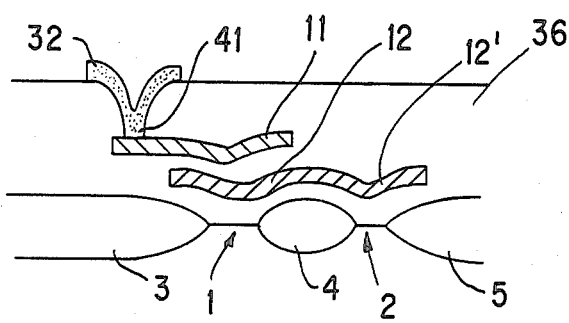
FIGS. 3A-3C are cross-sections respectively taken along the lines L—L', M—M' and N—N' in FIG. 2.
Figure 3B:
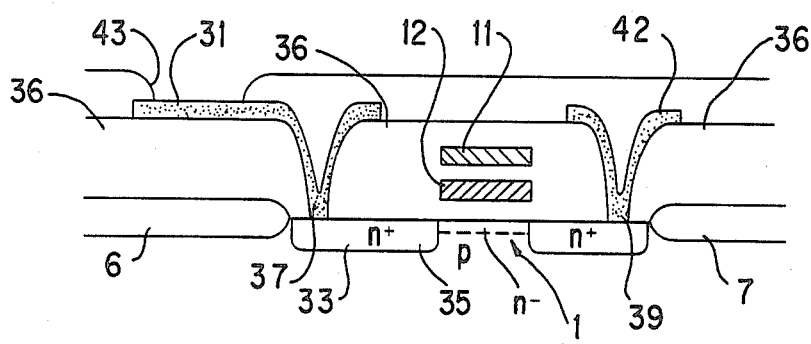
Figure 3C:
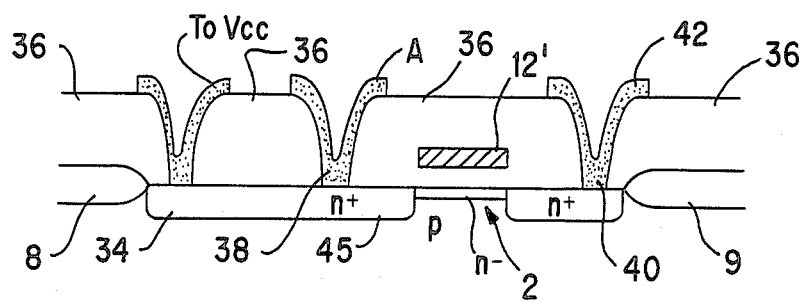

FIGS. 3A and 3B schematically illustrate the relative arrangement of the control gate 11 and the floating gate 12 in the first transistor 1 together with the gate of the second transistor 2 which is formed as the extension of the floating gate 12 of the first transistor 1. The gates 12 and 12' are formed to be electrically isolated by an insulating matrix 36, a silicon dioxide layer, for instance, and have no contact as shown in FIGS. 3A-3C. In FIGS. 3A-3C, reference numerals 3-9 designate field oxide layers for isolating the first and second transistors 1 and 2 from each other and from other transistors.

Referring back to FIG. 1, when a predetermined high voltage input signal of 15 volts, for example, is applied to the pad 31, the potential on the control gate 11 and the drain 35 of the first transistor 1 becomes high level, and the injection of electrons to the floating gate 12 occurs. The electron injection is carried out by the hot electrons produced by the high electric field in the pinched-off region adjacent the drain of the first transistor 1. Thus, electrons are accumulated on the floating gate 12 facing the control gate 11, and hence the second transistor 2 turns off due to the predetermined negative potential provided to the gate thereof from the floating gate 12, and the second transistor outputs a control signal A of a high level.

On the other hand, if an input signal is not provided to the pad 31, the generation of hot electrons does not take place and the electron accumulation on the floating gate 12 does not occur. Hence, the gate of the second transistor 2 is kept at low potential. Accordingly, the second transistor 2, which is a depletion type as mentioned before, is not turned off and a control signal A of low level is output.

It should be noted that the ROM circuit of the present invention as shown in FIG. 1 can avoid the so-called soft write in conventional ROMs having a floating gate, which comprise the first transistor 1 which is basically the same as a well-known SAMOS (stacked gate avalanche injection. MOS). In a conventional SAMOS, for example, the above mentioned electron injection may occur statistically with the application of a relatively low voltage such as a few volts. This is the soft write occurring during the read mode and causes an erroneous write into a ROM whose floating gate has not been provided with the carrier injection during the write mode. To avoid such soft write, the source-drain voltage must be restricted to as low as 1 volt or less, for example, in the read mode and complex circuits for the read-out and level conversion are required for the conventional ROMs.

However, in the control signal generating circuit as shown in FIG. 1, it is unnecessary to apply a voltage to the first transistor 1 except during the write mode, hence, the soft write is avoided. The read out of the information stored in the first transistor 1 is carried out by the second transistor. The second transistor 2, which is a depletion type, is turned off by the negative potential on the floating gate 12 of the first transistor and outputs a high level signal, while keeping its conduction to provide a low level signal if the floating gate 12 has not been provided with electron accumulation thereon.

As described above, the control signal generating circuit of the present invention uses information as to whether electrons are accumulated on the floating gate 12 of the first transistor 1 or not for determining the use of a redundant circuit, instead of the conventional means depending on the ON or OFF states of fuses and, therefore, the present invention can provide high reliability control signals. Further, the circuit of the present invention is simple, not requiring complex read-out and level conversion circuits and is suitable to be incorporated into an integrated circuit on a chip.

The reliability is equal to that achieved by using conventional EPROM (erasable programmable ROM) cells. In other words, the structure of an existing EPROM cell can be employed for the first transistor in the present invention. In the control signal generating circuit of the present invention, the electrons accumulated on the floating gate of a selected first transistor must be persistent so long as the circuit is used. Therefore, the erasable function by an ultraviolet (UV) light in an EPROM is not necessary for the circuit, and an OPTROM (one time PROM) equipped with no window for UV exposure is suitable as a substitute for the first transistor in the present invention.

Figure 5:
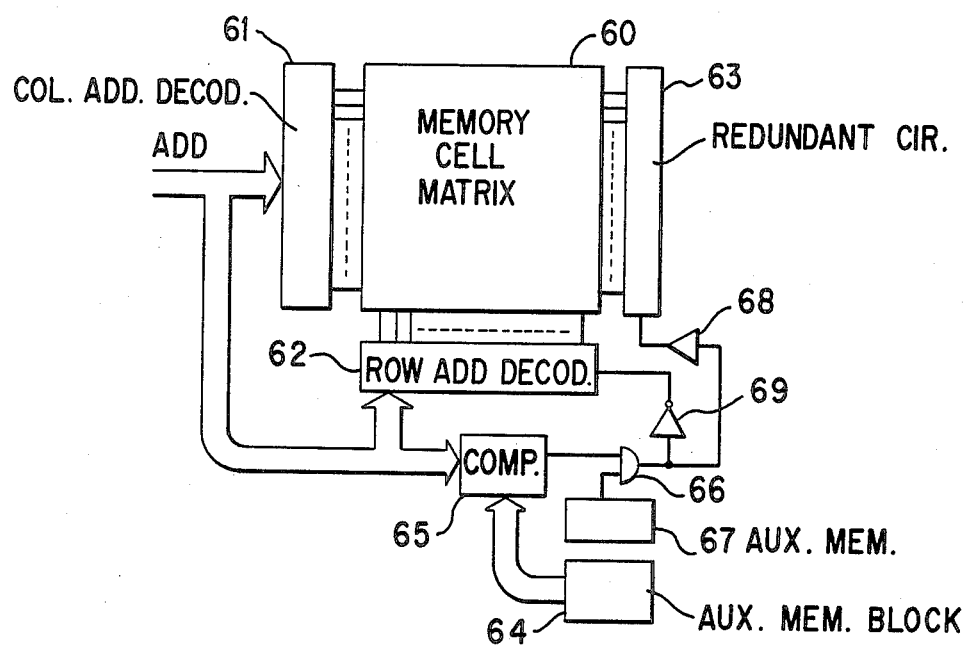
FIG. 5 is a circuit block diagram showing a conceptual configuration of a semiconductor memory circuit including a redundant circuit and a control signal generating circuit comprising the ROM circuits of the present invention.
Figure 4:
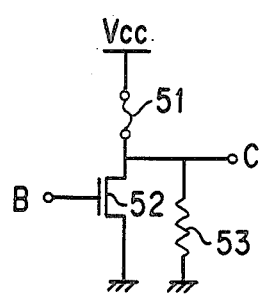
FIG. 4 is an equivalent circuit diagram showing an exemplary conventional control signal generating circuit including a fuse.

FIG. 5 is a circuit block diagram showing a conceptual configuration of a semiconductor memory circuit including a redundant circuit and a control signal generating circuit comprising the ROM circuits of the present invention. Referring to FIG. 5, the access to a memory cell in a memory cell matrix 60 is carried out according to the address data ADD input to a column address decoder 61 and a row address decoder 62 as in the conventional memory circuits. The memory circuit of FIG. 5 is provided with a redundant circuit 63 corresponding to a memory cell row in the matrix 60. If a faulty memory cell is detected during a test process, information relevant to the column address and row address of the faulty cell is stored in an auxiliary memory block 64 comprising the ROM circuits, each of which has the circuit configuration as shown in FIG. 1.

In the access to a selected memory cell, the incoming address data to the decoders 61 and 62 are compared with the information stored in the auxiliary memory block 64 by means of a comparator 65, and if correspondence between the incoming address data and the information is detected, the comparator 65 outputs a control signal for making the row address decoder inactive while activating the redundant circuit 63. Thus, the memory cell row containing the faulty cell is entirely replaced by the redundant circuit 63 and the normal operation of the memory circuit can be assured. If there is no faulty cell detected in the matrix 60, the output signal of the comparator 65 is checked by the gate 66 which outputs an effective control signal according to the fault information stored in another auxiliary memory 67 comprising a ROM circuit as shown in FIG. 1. In FIG. 5, a driver 68 actuates the redundant circuit 63 and an inverter 69 operates to activate the row address decoder 62 only when the output control signal from the comparator 65 is at a low level.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

We claim:

1. A read only memory (ROM) circuit operatively connected to first and second voltage sources, comprising:

terminal means for receiving a predetermined input signal only during a write mode;

a first transistor, said first transistor having a channel region, a control gate facing said channel region, a floating gate formed between said channel region and said control gate, a source connected to said first voltage source and a drain, wherein said control gate is connected to said terminal means;

second transistor of a depletion type, said second transistor having a gate connected to said floating gate of said first transistor, a source connected to said first voltage source and a drain forming an output node connected to said second voltage source; and first and second resistive means, said first resistive means being connected between said control gate and said drain of said first transistor, and said second resistive means connected between said output node of said second transistor and said second voltage source, wherein said first transistor stores information in accordance with the application of said predetermined input signal to said terminal means, and said second transistor operatively outputs a high or low signal from said output node in accordance with said information stored in said first transistor.

2. A read only memory (ROM) circuit as set forth in claim 1, having a diffusion layer wherein said first or second resistive means is formed from a part of said diffusion layer and wherein said source or drain region of said first or second transistor is formed in said diffusion layer.

3. A read only memory (ROM) circuit as set forth in claim 1, wherein each of said first and second transistors has an n-type conduction channel.

4. A read only memory (ROM) circuit as set forth in claim 1, wherein said first and second transistors are formed on a semiconductor substrate.

5. A read only memory (ROM) circuit as set forth in claim 4, wherein said floating gate of said first transistor and said gate of said second transistor are formed from the same conductive layer.

6. A read only memory (ROM) circuit as set forth in claim 5, wherein said floating gate of said first transistor and said gate of said second transistor are embedded in an insulating material matrix.

* * * * *